United States Patent
Li et al.

(10) Patent No.: US 9,311,954 B1
(45) Date of Patent: Apr. 12, 2016

(54) TAPE HEAD WITH THIN TAPE BEARING SURFACE COATING

(71) Applicant: Oracle International Corporation, Redwood City, CA (US)

(72) Inventors: Jianhua Li, Superior, CO (US); Michael J. Link, Lafayette, CO (US)

(73) Assignee: OPACLE INTERNATIONAL CORPORATION, Redwood City, CA (US)

( * ) Notice: Subject to any disclaimer, the term of this patent is extended or adjusted under 35 U.S.C. 154(b) by 0 days.

(21) Appl. No.: 14/645,551

(22) Filed: Mar. 12, 2015

(51) Int. Cl.
*G11B 15/00* (2006.01)

(52) U.S. Cl.
CPC ...................................... *G11B 15/00* (2013.01)

(58) Field of Classification Search
CPC .......... G11B 15/00; G11B 15/67; G11B 15/66
USPC ............................................................ 360/95
See application file for complete search history.

(56) References Cited

U.S. PATENT DOCUMENTS

| | | | | |
|---|---|---|---|---|
| 5,279,026 | A | * | 1/1994 | Uhde ........................ 29/603.16 |
| 5,475,552 | A | * | 12/1995 | Nasu et al. .................... 360/122 |
| 5,825,591 | A | * | 10/1998 | Nakamura et al. ......... 360/234.1 |
| 6,445,537 | B1 | | 9/2002 | Cates |
| 2003/0134151 | A1 | * | 7/2003 | Usuki .................... G11B 5/656 428/832.2 |
| 2010/0053817 | A1 | * | 3/2010 | Biskeborn et al. ............ 360/313 |
| 2010/0269565 | A1 | * | 10/2010 | Biskeborn et al. .................. 73/7 |

FOREIGN PATENT DOCUMENTS

JP        2011192341  A  *  9/2011

* cited by examiner

*Primary Examiner* — Allen T Cao
(74) *Attorney, Agent, or Firm* — Brooks Kushman P.C.

(57) ABSTRACT

A tape head is provided for use with a tape drive that is configured to receive a length of tape. The tape head includes a head body including at least one head element for performing read and/or write operations on the tape, and a protective layer extending over at least a portion of the head body for inhibiting wear of the head body when the tape is moved with respect to the head body. Furthermore, the protective layer is made of titanium oxide, chromium oxide, zirconium oxide, aluminum oxide, or zinc oxide.

7 Claims, 2 Drawing Sheets

TAPE HEAD WITH THIN TAPE BEARING SURFACE COATING

TECHNICAL FIELD

The present disclosure relates to the field of tape heads used for performing read and/or write operations on tape.

BACKGROUND

A tape drive used in magnetic tape applications may be provided with one or more magnetic tape heads that each include one or more head elements, e.g., thin film magnetic transducers, for performing read and/or write operations on a magnetic tape. For each tape head, the one or more head elements are typically fabricated on a substrate and covered with a top closure. A thick overcoat layer of alumina is also typically deposited between the head elements and the top closure.

During operation of the tape drive, the tape may be biased against the face of the tape head or heads as the tape is moved longitudinally relative to the heads. Rubbing between the tape and the tape heads may cause both items to wear. The substrates and closures of the tape heads are fabricated from hard materials to help minimize their wear. The head elements and associated overcoat layers, on the other hand, are fabricated from materials selected primarily for their magnetic and electrical properties, and may be softer than the substrates and closures.

The difference in hardness between the substrate and closure materials, on the one hand, and the head element and overcoat layer materials, on the other hand, may result in uneven wear at the face of the tape head due to contact with the tape. Because the head element and overcoat layer materials may be softer than the substrate and closure materials, the head element and overcoat layers may recess more quickly from the tape-head interface than do the substrate and closure. As a result, a concave shaped gap may develop over time between the head elements and the tape. This gap may cause poor read and write performance, and even total failure of the tape heads in severe recession cases.

A prior attempt to reduce wear of a tape head involved coating the tape head with a first layer of non-conductive silicon nitride, and a second layer of titanium applied over the layer of silicon nitride. Titanium has good wear characteristics, but it is conductive. As a result, the non-conductive silicon nitride layer is provided as an isolation layer between the tape head and the titanium layer.

SUMMARY

A tape head, according to the present disclosure, is provided for use with a tape drive that is configured to receive a length of tape. The tape head includes a head body including at least one head element for performing read and/or write operations on the tape, and a protective layer extending over at least a portion of the head body for inhibiting wear of the head body when the tape is moved with respect to the head body, the protective layer being made of titanium oxide, chromium oxide, zirconium oxide, aluminum oxide, or zinc oxide.

A tape drive, according to the present disclosure, for use with tape is also provided. The tape drive includes a drive body, and a tape head supported on the drive body. The tape head includes a head body including at least one head element for performing read and/or write operations on the tape, and a protective layer extending over at least a portion of the head body for inhibiting wear of the head body when the tape is moved with respect to the head body, the protective layer being a selected one of titanium oxide, chromium oxide, zirconium oxide, aluminum oxide, or zinc oxide.

Furthermore, a method is provided for making a tape head for a tape drive that is configured to receive a length of tape. The method may include applying a layer of material directly onto at least a portion of a head body that includes at least one head element for performing read and/or write operations on the tape, the layer of material being one of titanium, chromium, zirconium, aluminum, or zinc; and oxidizing the layer of material to form a protective layer, the protective layer being one of titanium oxide, chromium oxide, zirconium oxide, aluminum oxide, or zinc oxide.

Another method, according to the present disclosure, for making a tape head for a tape drive that is configured to receive a length of tape is also provided. The method includes applying a protective layer onto at least a portion of a head body that includes at least one head element for performing read and/or write operations on the tape, the protective layer being made of titanium oxide, chromium oxide, zirconium oxide, aluminum oxide, or zinc oxide.

While exemplary embodiments are illustrated and disclosed, such disclosure should not be construed to limit the claims. It is anticipated that various modifications and alternative designs may be made without departing from the scope of the invention.

DETAILED DESCRIPTION

As required, detailed embodiments are disclosed herein. It is to be understood, however, that the disclosed embodiments are merely exemplary and that various and alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

Figure 1:
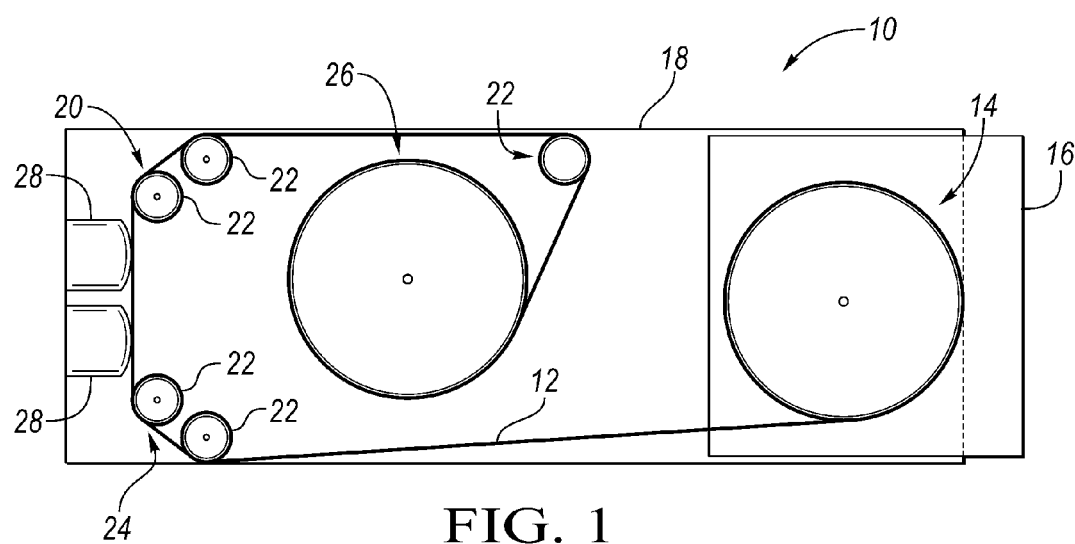
FIG. 1 is a plan view of a tape drive including multiple tape heads according to the present disclosure.

FIG. 1 shows a data storage device in the form of a tape drive 10, according to the present disclosure, for use with a tape 12, such as a magnetic tape or optical tape. While the tape 12 may be provided in any suitable manner, in the illustrated embodiment, the tape 12 is provided by a cartridge reel 14 of a tape cartridge 16 that is insertable into and removable from the tape drive 10. The tape drive 10 shown in FIG. 1 includes a drive chassis or body 18 configured to receive the tape cartridge 16, a tape guide arrangement 20 including one or more tape guides 22 (e.g., tape guide rollers and/or fixed taped guides) mounted on the drive body 18 for guiding the tape 12 along a tape path 24 to a take-up reel 26, and one or more heads 28, such as magnetic heads or optical heads or pick-up units, for reading data from and/or writing data to the tape 12 as the tape 12 is moved over or adjacent to the heads 28.

Figure 2:
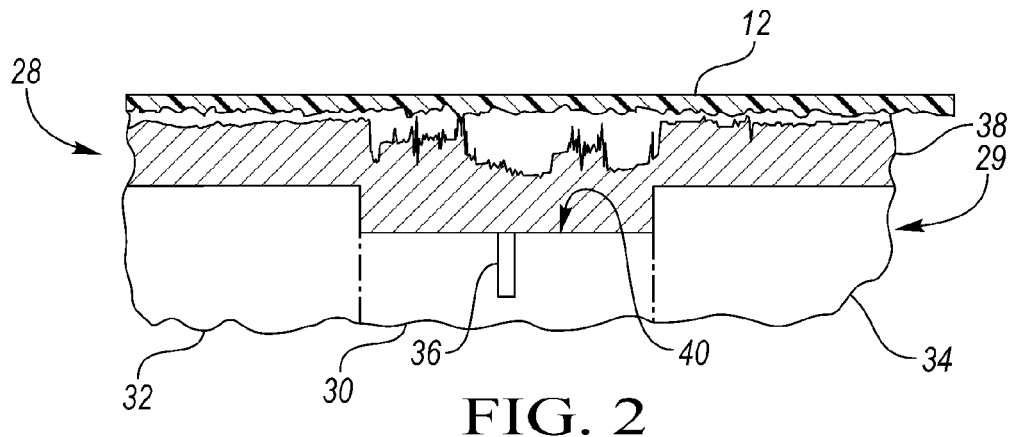
FIG. 2 is an enlarged fragmentary cross-sectional view of one of the tape heads shown in FIG. 1, wherein the tape head includes a head body and a protective coating or layer disposed at least partially.

Referring to FIG. 2, an enlarged fragmentary cross-sectional view of one of the tape heads 28 is shown in order to explain further details of the tape head 28, which details may also apply to any other tape head 28 provided with the tape drive 10. The tape head 28 shown in FIG. 2 is a magnetic tape head and includes a head body 29 having a device region 30 positioned between two head bulk material regions or sections, such as a substrate 32 and a closure 34. The device region 30 may include one or more head sensors or elements 36 (e.g., transducers) shown schematically in FIGS. 2 and 3, as well as any other suitable layers or materials, such as overcoat layers and/or insulating layers that may be made of any suitable material (e.g., alumina). The head elements 36 may be read and/or write elements for performing read and/or write operations on the tape 12.

Figure 3:
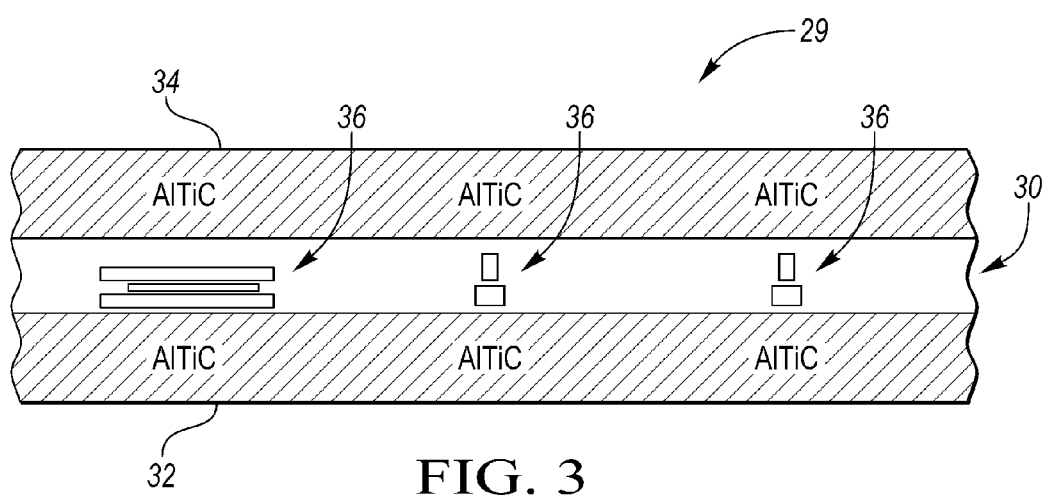
FIG. 3 is a fragmentary side view of the tape head shown in FIG. 2, with the protective layer removed to show the underlying portion of the tape head.

The device region 30 shown in FIG. 3 includes three head elements 36 for illustration purposes (e.g., one read element and two write elements). The device region 30 may, however, be provided with any suitable number of head elements 36 (e.g., any suitable number of read elements and/or any suitable number of write elements). For example, the device region 30 may be provided with 10 to 100 head elements 36. As a more specific example, the device region 30 may be provided with 52 read elements or 32 write elements and 2 read elements. As another more specific example, the device region 30 may be provided with 34 read elements or 32 write elements and 2 read elements. In yet another embodiment, the device region 30 may include one or more head elements 36 that are each formed as a combined read-write element. Furthermore, the head elements 36 may be arranged in any suitable orientation. For example, the device region 30 may include read and write elements that alternate with each other, or similar head elements 36 may be arranged in groups (e.g., a group of multiple read elements may be followed by a group of multiple write elements).

As further shown in FIG. 2, the tape head 28 is provided with a protective coating or layer 38 that extends over at least a portion of the head body 29 (e.g., at least partially over the device region 30) for inhibiting wear of the head body 29 when the tape 12 is moved with respect to the head body 29. For example, the protective layer 38 may initially be applied over the entire surface (e.g., face or tape-head interface) of the head body 29, or substantially over the entire surface of the head body 29 (e.g., greater than 90% of the head body), such that the protective layer 38 is located between the head body 29 and the tape 12 when the tape 12 is moved over the tape head 28. In the embodiment shown in FIG. 2, the protective layer 38 is disposed directly on the device region 30, substrate 32 and closure 34. Furthermore, the protective layer 38 may extend entirely, or substantially entirely, over a surface 40 (e.g., face or tape-head interface) of the device region 30, as well as entirely, or substantially entirely, over corresponding surfaces (e.g., faces or tape-head interfaces) of the substrate 32 and closure 34.

The protective layer 38 may be made of a material selected from the group consisting of titanium oxide, chromium oxide, zirconium oxide, aluminum oxide and zinc oxide. Furthermore, the protective layer 38 may be formed in any suitable manner (e.g., by any suitable method). For example, after the head body 28 has been fabricated in any suitable manner, a layer of titanium oxide, chromium oxide, zirconium oxide, aluminum oxide, or zinc oxide may be applied directly on the head body 29 by any suitable application technique. As a more detailed example, a layer of any of the above materials may be applied by one or more of sputtering, atomic layer deposition (ALD), chemical vapor deposition (CVD), or pulsed laser deposition (PLD). Because each of the above materials is electrically non-conductive, no isolation layer is needed between the head body 29 and the protective layer 38.

As another example, a layer of material selected from the group consisting of titanium, chromium, zirconium, aluminum and zinc may be applied directly on the head body 29 in any suitable manner, and then the layer of material may be oxidized in any suitable manner to form the protective layer 38, such that the protective layer 38 is made of a selected one of titanium oxide, chromium oxide, zirconium oxide, aluminum oxide, or zinc oxide. As a more detailed example, a layer of titanium, chromium, zirconium, aluminum, or zinc may be applied by one or more of the above application techniques, and then the layer may be oxidized by exposing the layer to an oxygen environment (e.g., oxygen gas, or gas mixture including oxygen) at an elevated temperature (e.g., temperature in the range of 50° C. to 150° C.) so that the entire thickness of the layer is oxidized to form the protective layer 38. Exposing the layer to an oxygen environment may include positioning the tape head 28 in a container (e.g., chamber or oven), and then introducing oxygen gas or gas mixture including oxygen through a gas line into the container. Furthermore, if the oxygen environment includes a gas mixture, the percent of oxygen may be at least 20% of the gas mixture, or at least 50% of the gas mixture, for example.

As another more detailed example, the layer of titanium, chromium, zirconium, aluminum, or zinc may be exposed to an oxygen plasma to form the layer of titanium oxide, chromium oxide, zirconium oxide, aluminum oxide, or zinc oxide. Furthermore, such exposure may occur at any suitable temperature, such as a temperature in the range of 50° C. to 300° C., or a temperature in the range of 50° C. to 150° C. The oxygen plasma can be created or formed in any suitable manner, such as by heating oxygen gas or subjecting it to a strong electromagnetic field applied with a laser or microwave to create positive or negative charged particles (i.e., ions). As another example, the oxygen plasma may be created by exposing oxygen gas at a low pressure (e.g., under a vacuum) to high power radio waves.

The protective layer 38 may also have any suitable thickness. For example, the protective layer 38 may have a thickness in the range of 4 to 25 nanometers (nm). In one embodiment, the protective layer 38 may have a thickness less than 20 nm. In another embodiment, the protective layer 38 may have a thickness less than 15 nm. In yet another embodiment, the protective layer 38 may have a thickness less than 10 nm.

If the protective layer 38 is formed by first applying a layer of material selected from titanium, chromium, zirconium, aluminum, or zinc to the head body 29 and then oxidizing the layer of material, the thickness of the layer of material may be less than the above values, since the layer of material may expand during the oxidizing step. For example, the layer of material deposited on the head body 29 may have a thickness in the range of 2 to 20 nm. In one embodiment, the layer of material may have a thickness less than 15 nm. In another embodiment, the layer of material may have a thickness less than 10 nm. In yet another embodiment, the layer of material may have a thickness less than 6 nm. Thus, the steps of applying the layer of material and oxidizing the layer of material may be performed such that the resulting protective layer 38 (e.g., layer of titanium oxide, chromium oxide, zirconium oxide, aluminum oxide, or zinc oxide) has a thickness in the range of 4 to 25 nm, or less than 20 nm, or less than 15 nm, or less than 10 nm.

As mentioned above, the protective layer 38 may inhibit or prevent wear of the head body 29, and specifically the device region 30, when the tape 12 is moved over the tape head 28 and contacts the tape head 28. In the embodiment shown in FIG. 4, for example, the protective layer 38 (which is made of titanium oxide in this embodiment) remained largely intact over the device region 30 after a wear test was performed in which the tape 12 was moved over the tape head 28 for 2,100 hours at a speed of 5.6 meters/second (i.e., the tape head 28 was subjected to millions of meters of tape 12). Because the protective layer 38 may inhibit or prevent erosion of the head elements 36 and corresponding overcoat layers of the device region 30, accuracy of read and/or write operations performed by the tape head 28 may be maintained, and life of the tape head 28 may be significantly increased compared to prior tape heads.

Furthermore, because the protective layer 38 is electrically non-conductive, as mentioned above, the overall thickness of the protective layer 38 may be reduced compared to prior coatings that include a wear protection layer and an isolation layer positioned between a head body and the wear protection layer. As a result, magnetic spacing between the surface 40 of the device region 30 and the tape 12 may be reduced compared to prior tape heads. In addition, due to isolation improvement, yield loss may be reduced by about 6% compared to prior coatings that include a conductive layer.

Figure 4:
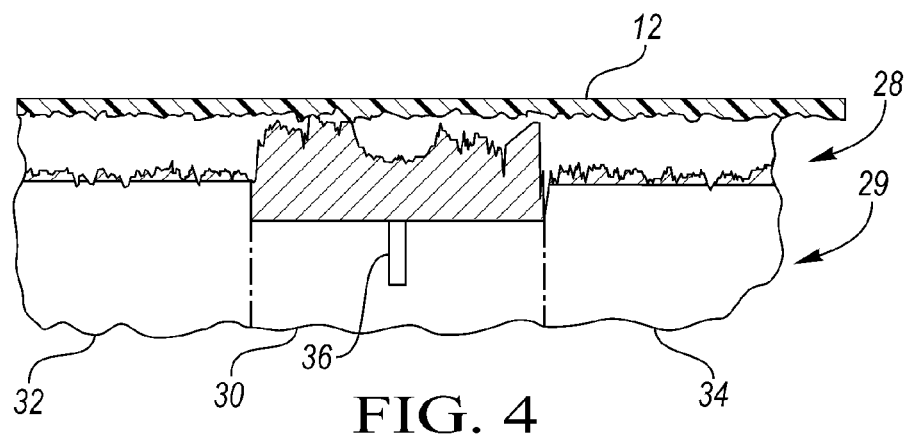
FIG. 4 is an enlarged fragmentary cross sectional view of the tape head similar to FIG. 2, after a wear test was performed on the tape head.

In the embodiment shown in FIG. 4, the portion of the protective layer 38 disposed on the substrate 32 and closure 34 has eroded more than the portion of the protective layer 38 disposed on the device region 30 after the wear test. This may be due to better adhesion between the protective layer 38 and the device region 30, as compared to adhesion between the protective layer 38 and each of the substrate 32 and closure 34. For example, the protective layer 38 may bond better to the material (e.g., alumina) of the device region 30, as compared to the material (e.g., aluminum titanium carbon) of the substrate 32 and closure 34.

Figure 5:
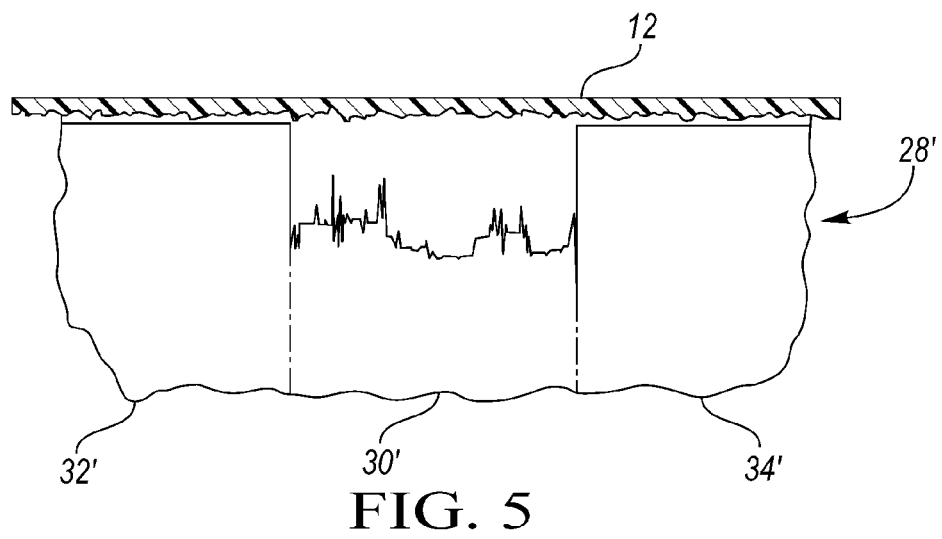
FIG. 5 shows a tape head provided without a protective coating or layer and after a wear test was performed on the tape head.

For comparison purposes, FIG. 5 shows a tape head 28' provided without a protective layer 38 and after a wear test, similar to the wear test described above, was performed on the tape head 28'. As shown in FIG. 5, device region 30' has eroded significantly, such that a relatively large gap exists between a surface 40' (e.g., face or tape-head interface) of the device region 30'. That gap may adversely affect read and/or write operations performed by the tape head 28'.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for making a tape head for a tape drive that is configured to receive a length of tape, the method comprising:
    applying a layer of material directly onto at least a portion of a head body that includes at least one head element for performing read and/or write operations on the tape, the layer of material being one of titanium, chromium, zirconium, aluminum, or zinc; and
    subsequently oxidizing the layer of material to form a protective layer, the protective layer being one of titanium oxide, chromium oxide, zirconium oxide, aluminum oxide, or zinc oxide.

2. The method of claim 1 wherein the applying and oxidizing steps are performed such that the protective layer has a thickness less than 20 nanometers.

3. The method of claim 1 wherein the applying is performed such that the protective layer has a thickness less than 15 nanometers.

4. The method of claim 1 wherein the oxidizing comprises exposing the layer of material to an oxygen plasma.

5. The method of claim 1 wherein the oxidizing comprises exposing the layer of material to an environment comprising oxygen.

6. The method of claim 1 wherein the oxidizing comprises exposing the layer of material to a temperature in the range of 50 to 300° C.

7. The method of claim 1 wherein the head body includes a device region positioned between two head bulk material regions, and the device region comprises the at least one head element, wherein the applying is performed such that the layer of material extends at least partially over the device region, and wherein the layer of material comprises titanium oxide.

* * * * *